(12) United States Patent
Aoki (10) Patent No.: US 7,528,523 B2
(45) Date of Patent: May 5, 2009

(54) SURFACE ACOUSTIC WAVE DEVICE AND MANUFACTURING METHOD THEREOF

(75) Inventor: Shinya Aoki, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 222 days.

(21) Appl. No.: 11/470,933

(22) Filed: Sep. 7, 2006

(65) Prior Publication Data

US 2007/0057597 A1    Mar. 15, 2007

(30) Foreign Application Priority Data

Sep. 13, 2005    (JP) ............................. 2005-264877

(51) Int. Cl.
*H01L 41/08*    (2006.01)
(52) U.S. Cl. ................... 310/313 R; 310/344
(58) Field of Classification Search ............. 310/313 R, 310/344, 348
See application file for complete search history.

(56) References Cited

U.S. PATENT DOCUMENTS

| 5,821,665 | A | * | 10/1998 | Onishi et al. ............. 310/313 R |
| 5,991,989 | A | * | 11/1999 | Onishi et al. ................ 29/25.35 |
| 7,002,282 | B2 | * | 2/2006 | Mishima .................. 310/313 R |
| 7,246,421 | B2 | * | 7/2007 | Namba et al. .............. 29/25.35 |
| 7,259,500 | B2 | * | 8/2007 | Iwamoto et al. ............. 310/340 |
| 7,385,463 | B2 |  | 6/2008 | Koga et al. |
| 2003/0006863 | A1 | * | 1/2003 | Inoue .......................... 333/193 |

FOREIGN PATENT DOCUMENTS

| CN |  | 1638272 A | 7/2005 |
| JP | A | 8-213874 | 8/1966 |
| JP | A | 08-307197 | 11/1996 |
| JP | A | 2004-153412 | 5/2004 |
| JP | A | 2006-174311 | 6/2006 |

* cited by examiner

*Primary Examiner*—Mark Budd
(74) *Attorney, Agent, or Firm*—Oliff & Berridge, PLC (57) ABSTRACT

A surface acoustic wave device includes: an IDT electrode formed at a main surface of a piezoelectric substrate, an extraction electrode extracted from the IDT electrode; a surface acoustic wave chip having a metal junction formed along a periphery of the main surface of the piezoelectric substrate; a contact electrode made of an insulating material, connecting to the extraction electrode formed at one main surface thereof; an external electrode formed at the other main surface of the contact electrode; and a cover substrate having a through-hole electrode for connecting the contact electrode to the external electrode. The IDT electrode and the extraction electrode are hermetically sealed in an interior of the space formed by bonding the surface acoustic wave chip to the cover substrate through the metal junction. The interior of the space contains an auxiliary section having enough height to prevent the cover substrate from coming in contact with the IDT electrode even in the case of distortion in the piezoelectric substrate or the cover substrate, the auxiliary section formed at the main surface of the piezoelectric substrate.

3 Claims, 5 Drawing Sheets

SURFACE ACOUSTIC WAVE DEVICE AND MANUFACTURING METHOD THEREOF

BACKGROUND OF THE INVENTION

1. Technical Field

This present invention relates to a surface acoustic wave device and a manufacturing method thereof, and in particular, relates to a surface acoustic wave device and a manufacturing method thereof, including an auxiliary section for preventing contact between an IDT electrode and a cover substrate.

2. Related Art

Generally, such a surface acoustic wave device has been known, that a surface acoustic wave chip is composed of IDT electrodes, extraction electrodes, and anode junctions disposed in a manner to surround these IDT electrodes and extraction electrodes, in which the IDT electrodes, the extraction electrodes, and the anode junction are placed on a piezoelectric substrate. In such the surface acoustic wave device, furthermore, an insulating cover substrate is composed of a glass plate having an air gap and through holes formed therein, the external electrodes formed to the through holes and peripheries of the through holes, and printed electrodes formed beside the external electrode. Yet further, the extraction electrode of the surface acoustic wave chip is bonded to the external electrode of the cover substrate while the anode junction is bonded to the cover substrate to seal the IDT electrode.

Furthermore, such an surface acoustic wave device has also been proposed, as composed of a cover substrate not formed with the air gap and a surface acoustic wave chip un which a film thickness of an extraction electrode and an anode junction set to about 3 μm thicker than that of the aforementioned extraction electrode and anode junction. In such the surface acoustic wave device, the air gap is formed between the IDT electrode and the cover substrate by the extraction electrode and the anode junction.

JP-A-8-213874, see page 3 through page 5 and FIGS. 1, 3, and 8, is an example of related art With the aforementioned structure such as described in the above example, in which the air gap is formed at the cover substrate, the air gap is formed at the cover substrate such that the IDT electrode and the cover substrate are not brought in contact with each other even where they become distorted by an externally applied force. With this structure, therefore, the whole cover substrate is necessary to be made thick to ensure strength thereof, which is unsuitable for the slimming down of surface acoustic wave devices.

Furthermore, with the structure in which the extraction electrode and the anode junction are made thick to ensure the air gap between the IDT electrode and the cover substrate, it is conceivable that the cover substrate and the IDT electrode are undesirably brought in contact with each other in the case of, e.g., occurrence of distortion in a center position of the cover substrate. Yet further, with this structure, a reflector or a reflecting barrier which are formed to a general surface acoustic wave chip, cannot be disposed since the extraction electrode is disposed at each end of the IDT electrode in a surface-wave direction, and thus it is estimated that the exact resonant frequency cannot be obtained.

SUMMARY

An advantage of some aspects of the present invention is to solve the aforementioned problems and to provide a surface acoustic wave device and a manufacturing method thereof, which realizes downsizing and slimming-down while having a structure such that the IDT electrode and the cover substrate do not come in contact with each other even where the piezoelectric substrate and the cover substrate get distorted.

A surface acoustic wave device according to first aspect of the invention includes: an IDT electrode formed at a main surface of a piezoelectric substrate; an extraction electrode extracted from the IDT electrode; a surface acoustic wave chip having a metal junction formed along a periphery of the main surface of the piezoelectric substrate, a contact electrode made of an insulating material, connecting to the extraction electrode formed at one main surface thereof, external electrode formed at the other main surface of the contact electrode; and a cover substrate having a through-hole electrode for connecting the contact electrode to the external electrode. The IDT electrode and the extraction electrode are hermetically sealed in an interior of the space formed by bonding the surface acoustic wave chip to the cover substrate through the metal junction. The interior of the space contains an auxiliary section having enough height to prevent the cover substrate from coming in contact with the IDT electrode even in the case of distortion in the piezoelectric substrate or the cover substrate, the auxiliary section formed at the main surface of the piezoelectric substrate.

According to the first aspect of the invention, the IDT electrode and the extraction electrode are formed inside the hermetically-sealed space, and the interior of the space contains the auxiliary section having a height sufficient to prevent the cover substrate from coming in contact with the IDT electrode even where the piezoelectric substrate or the cover substrate gets distorted. Since the auxiliary section is formed thinner than a height of the space but thicker than a thickness of the IDT electrode, the slim surface acoustic wave device can be realized without setting the height of the space to higher by room to prevent contact between the cover substrate and the IDT electrode, nor setting the cover substrate to thick to ensure strength thereof, so that such an effect can be obtained, that a resonant frequency can be prevented becoming unstable due to contact between the IDT electrode and the cover substrate.

Furthermore, this auxiliary section can be disposed in a margin space inside the space, left for the IDT electrode and the extraction electrode, thereby not requiring increase of the piezoelectric substrate and the cover substrate in flatbed size, so that the downsized surface acoustic wave device can be realized.

Furthermore, it is preferable that the auxiliary section be a metal film formed in a longitudinal direction of the IDT electrode, near but without contact with the IDT electrode.

As described above, disposal of the auxiliary section made of the metal film along a vicinity of the IDT electrode can realize downsizing and slimming-down of the surface acoustic wave device while preventing contact between the cover substrate and the IDT electrode. Furthermore, the embodiments explained later will describe in detail but the auxiliary section is made of the metal film, thereby being easily formed in a part of the step of forming the IDT electrode or the extraction electrode.

In this case, it is preferable that the extraction electrode be formed mainly in a scope of a formation region of the IDT electrode in a longitudinal direction thereof, and that the piezoelectric substrate and the cover substrate be formed to have a total thickness thereof in a bonded state set to equal to the height of the space in a manner to have a combined function of the auxiliary section.

Formation of the extraction electrode in this manner enables the extraction electrode to have a function of the auxiliary section in addition to an original function of connecting to the external electrode, so that the aforementioned effect can be obtained without newly forming the auxiliary section. This extraction electrode can be formed in a scope of a flatbed size and a free space set for the extraction electrode having the original function, thereby not rendering the surface acoustic device to become larger in size.

In this case, furthermore, it is preferable that the auxiliary section be formed at a surface of a busbar composing the IDT electrode.

The busbar composes the IDT electrode together with the interdigital electrodes but a resonant frequency is not affected even where the auxiliary section is disposed to a surface of the busbar. Therefore, in the case of disposal of the auxiliary section to the surface of the busbar, the auxiliary section is to be disposed to the nearest location to the IDT electrode, so that a purpose of this invention can be achieved even where a height of the auxiliary is set short. Furthermore, a region occupied by the auxiliary section is within a scope of the IDT electrode, thereby not requiring a special space for the auxiliary section.

According to the second aspect of this invention, a method of manufacturing a surface acoustic wave device includes forming a surface acoustic wave chip including an IDT electrode formed at a main surface of a piezoelectric substrate, an extraction electrode extracted from the IDT electrode, a metal junction formed along a periphery of the main surface of the piezoelectric substrate, and an auxiliary section, forming a cover substrate including a contact electrode connecting to the extraction electrode formed at one main surface of the contact electrode, an external electrode formed at the other main surface of the contact electrode, and a through-hole electrode connecting the contact electrode to the external electrode, bonding the surface acoustic wave chip to the cover substrate through the metal junction, and sealing hermetically the through-hole electrode, wherein an auxiliary section is formed to have enough height to prevent the cover substrate from coming in contact with the IDT electrode even in the case of distortion in the piezoelectric substrate or the cover substrate.

The aforementioned auxiliary section can be formed in a part of the step of forming the extraction electrode or the IDT electrode without being accompanied by such a sharp increase in the step as resulted from formation of the auxiliary section.

Furthermore, the extraction electrode is connected to the outer external electrode through the through-hole electrode formed at the cover substrate, thereby not crossing across the metal junction, so that the hermeticity in the space can be retained.

In this case, it is preferable that the step of forming the auxiliary section include disposing the section up to a predetermined thickness after formation of a first layer of the auxiliary section, made of the same material as that of the extraction electrode, at a position distant from the IDT electrode and the extraction electrode, in the step of forming the extraction electrode or the metal junction.

Herein, the auxiliary section is made from an electrically independent metal film of the same material as that of the extraction electrode or the metal junction.

Therefore, the auxiliary section is formed in the step of forming the extraction electrode or the metal junction and further, a step of making the auxiliary section to be a predetermined thickness is added to this step, so that the auxiliary section ca be formed by laminating one or more layer made of a metal film correspondingly to a required thickness of the auxiliary section.

In this case, it is preferable that the extraction electrode be formed mainly in a scope of a formation region of the IDT electrode in a longitudinal direction thereof, in a manner to have a thickness corresponding to an inner surface of the cove substrate at the time of bonding the surface acoustic wave chip to the cover substrate.

In this manner, the extraction electrode can be made with a thickness sufficient to contact with the cover electrode and further, formed along the IDT electrode, so that a height of an inner surface of the cover substrate can be restricted by the extraction electrode. That is, this extraction electrode can also have a function of the auxiliary section. Therefore, the step of forming the auxiliary section becomes unnecessary, thereby enabling the step of manufacturing the surface acoustic wave chip to be simplified.

In this case, it is preferable that formation of the auxiliary section include disposing the section up to a predetermined thickness after formation of the first layer of the auxiliary section at a vicinity of the IDT electrode in the same manner as the IDT electrode in the step of forming IDT electrode.

As described above, the first layer of the auxiliary section is formed from the same material as that of the IDT electrode with the same thickness as that of the IDT electrode and further, more layers are laminated so the auxiliary section as to have a predetermined thickness, so that the auxiliary section is certainly formed thicker than the IDT electrode at a vicinity of the IDT electrode, so that contact between the IDT electrode and the cover substrate can be prevented.

In this case, it is preferable that the auxiliary section be formed to have a predetermined thickness in a different step from the steps of forming the IDT electrode and the extraction electrode.

In this manner, the auxiliary section can be formed by arbitrarily selecting the material and the manufacturing step different from those of the IDT electrode or the extraction electrode.

In this case, it is preferable that the auxiliary section be formed by disposing the same material as that of the IDT electrode, to a predetermined thickness, to a surface of a busbar composing the IDT electrode after the step of forming the IDT electrode.

As described above, in the case of disposal of the auxiliary section to a front surface of the busbar, the auxiliary section is to be disposed at the nearest location to the IDT electrode, so that a purpose of this invention can be achieved even where a height of the auxiliary section is set to short. Furthermore, a region occupied by the auxiliary section is within a scope of the IDT electrode.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to drawings. Described in this embodiment is a resonator as one suitable example of a surface acoustic wave device to which this invention is applied.

Figure 5:
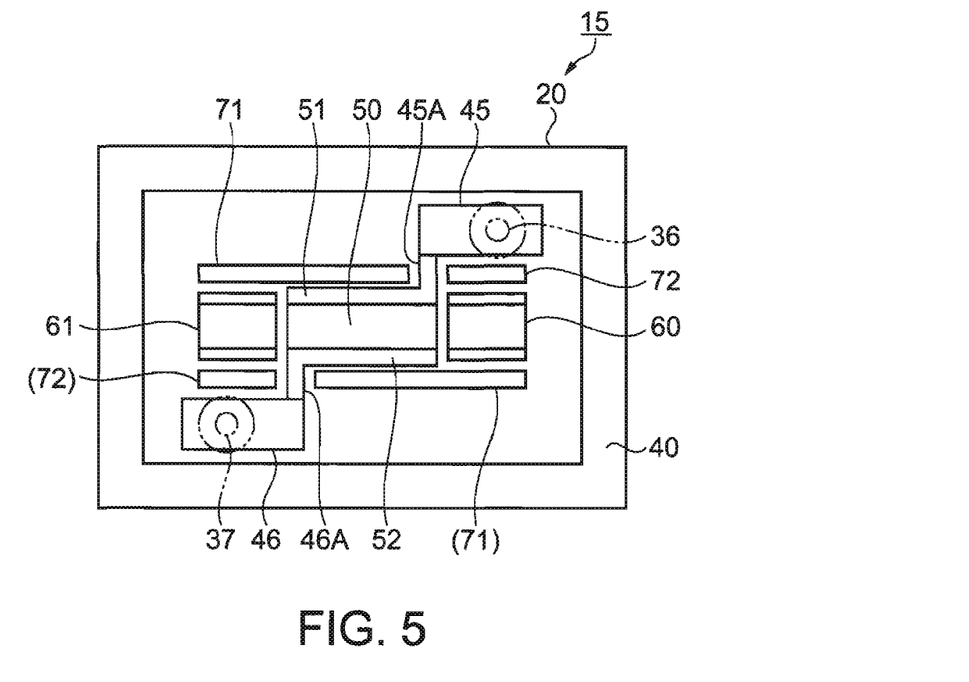
FIG. 5 is a plan view showing a surface acoustic wave chip according to a first modification example of the first embodiment of this invention.
Figure 6:
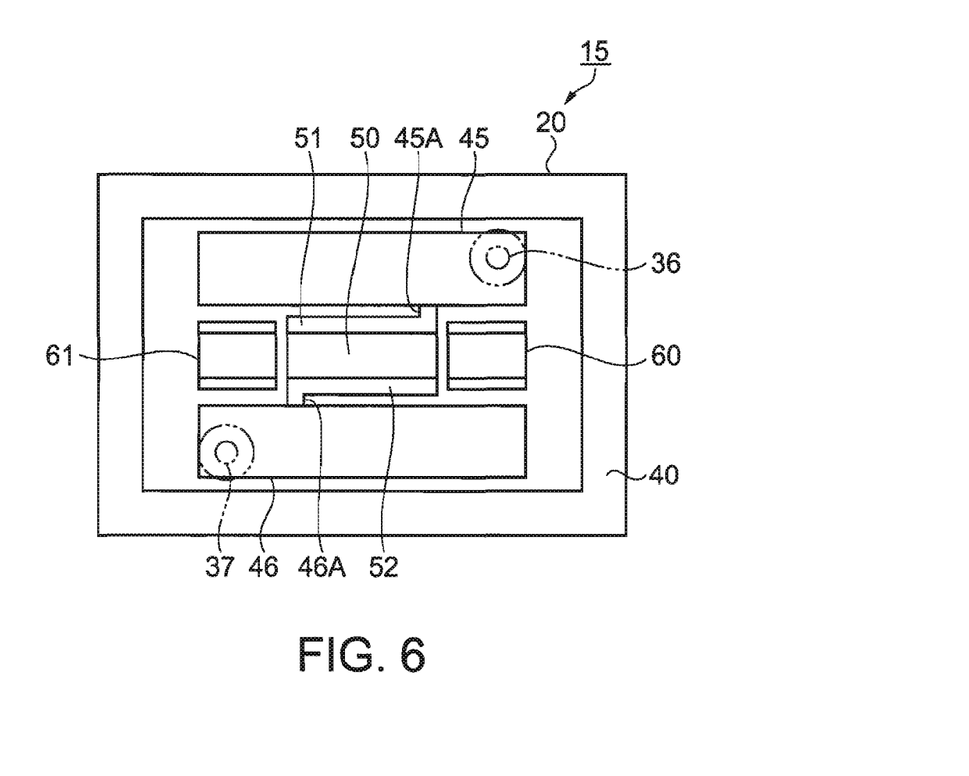
FIG. 6 is a plan view showing a surface acoustic wave chip according to a second modification example of the first embodiment of this invention.
Figure 7A:
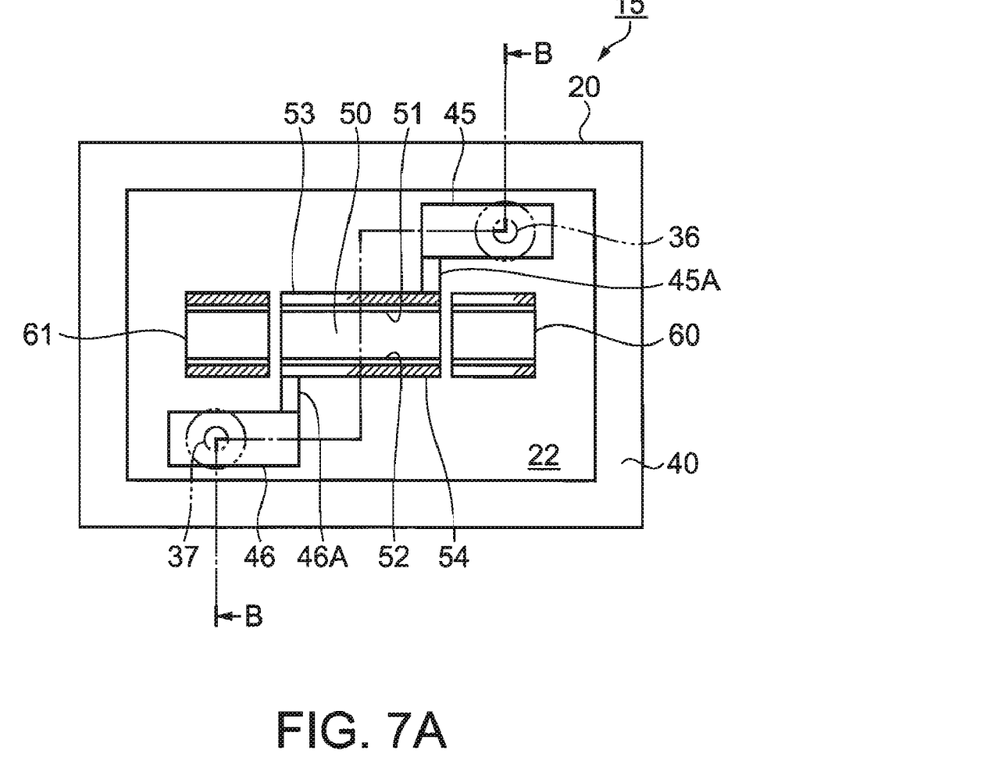
FIG. 7A is a plan view showing a surface acoustic wave chip according to a second embodiment of this invention.
Figure 7B:
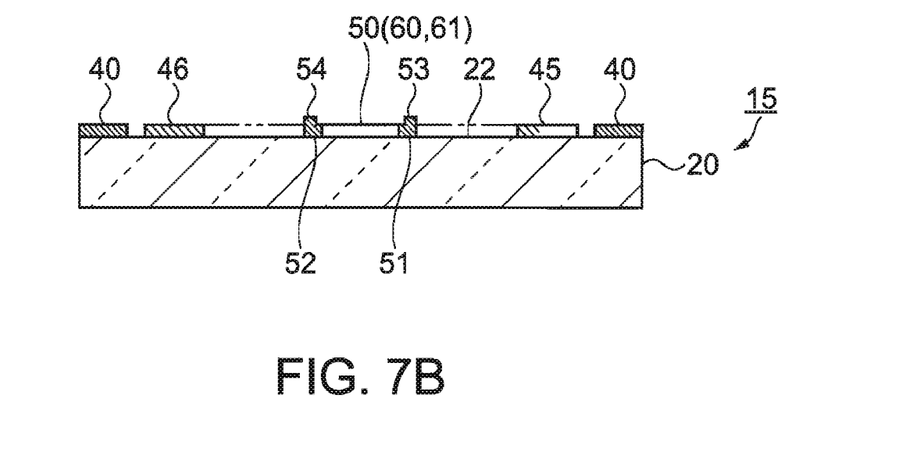
FIG. 7B is a cross-sectional view showing a section B-B of Fig. A.

FIGS. 1 through 4 show a structure and a manufacturing method of the surface acoustic wave device according to the first embodiment of this invention. FIG. 5 shows a first modification example of the first embodiment. FIG. 6 shows a second modification example of the first embodiment. FIG. 7 shows a second embodiment.

First Embodiment

FIGS. 1 through 4 show a structure and a manufacturing method of a surface acoustic wave device according to a first embodiment of this invention.

Figure 1A:
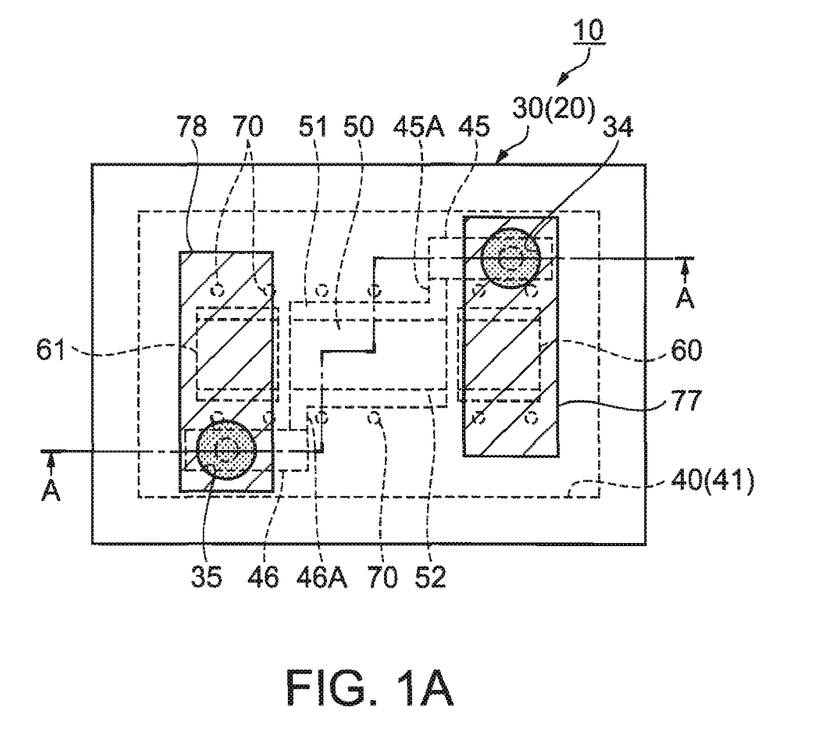
FIG. 1A is a plan view and FIG. 1B is a cross-sectional view of a surface acoustic wave device according to the first embodiment of this invention.
Figure 1B:
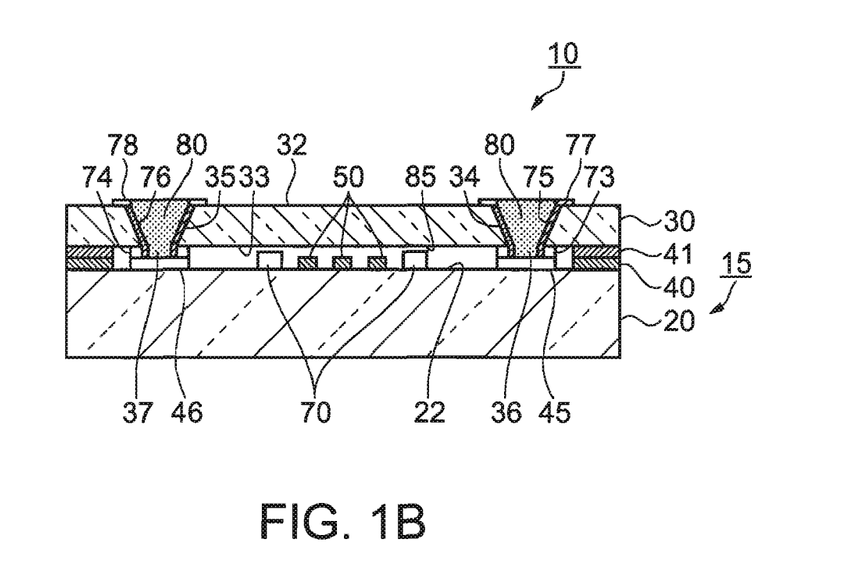
Figure 2:
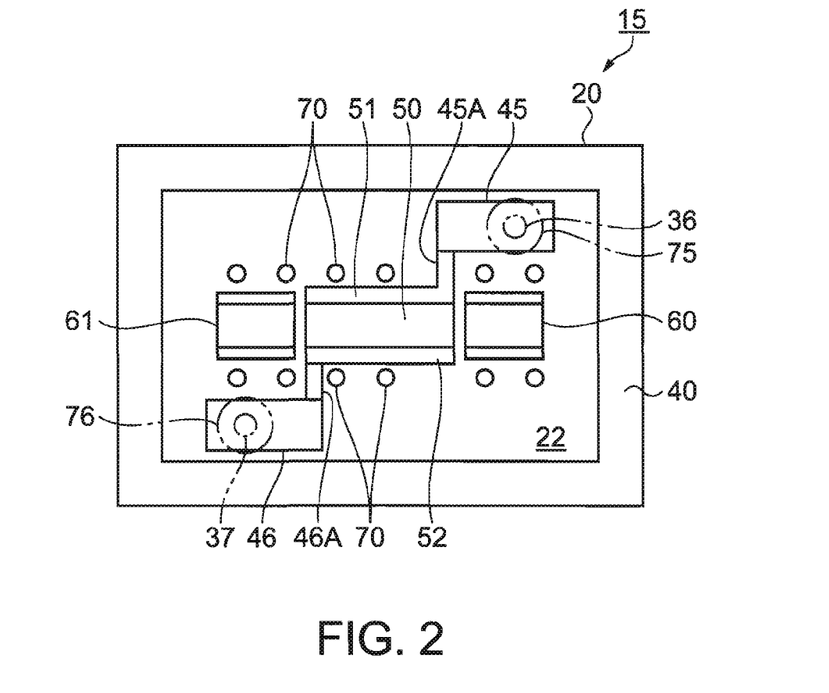
FIG. 2 is a plan view of a surface acoustic wave chip according to the first embodiment of this invention.
Figure 3:
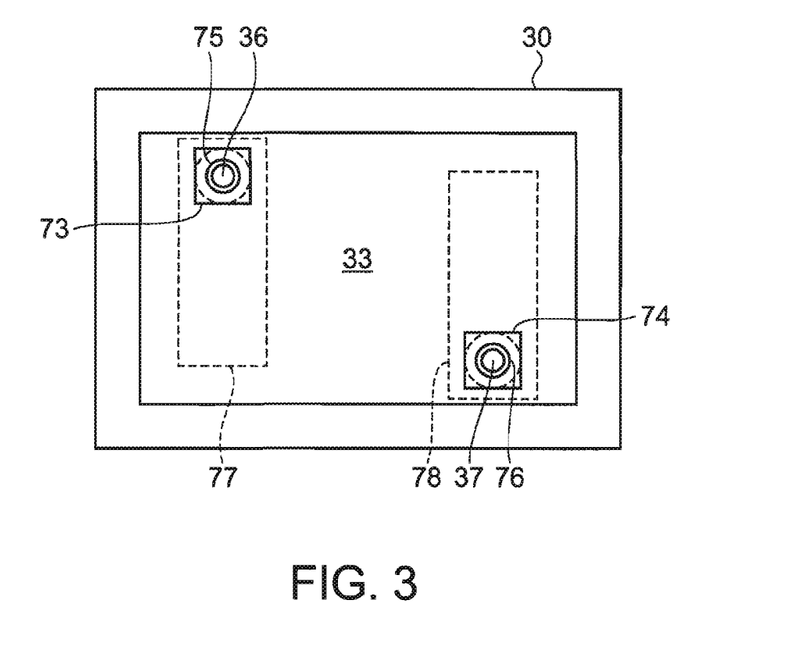
FIG. 3 is a plan view of a cover substrate according to the first embodiment of this invention.

FIG. 1 shows a surface acoustic wave device according to this embodiment, in which FIG. 1A shows a plan view thereof while FIG. 1B shows a cross-sectional view showing a section A-A of Fig. A. FIG. 2 shows a plan view of a surface acoustic wave chip 15. FIG. 3 shows a plan view of a cover substrate 30. In FIGS. 1 through 3, a surface acoustic wave device 10 is composed of a surface acoustic wave chip 15 having an Interdigital Transducer (IDT) electrode 50, and a cover substrate 30 which is laminated and directly bonded to an upper surface of the surface acoustic wave chip 15.

The surface acoustic wave chip 15 is composed of a piezoelectric substrate 20 in a short size which has a front surface 22 as a main surface. An approximate center position of the front surface 22 is provided with the IDT electrode 50 composed of a pair of interdigital electrodes and busbars 51, 52 therefor, and reflectors 60, 61 are respectively formed at both end sides of the piezoelectric substrate 20 in a longitudinal direction, i.e., a surface-wave direction. In the meantime, illustration of detailed shapes of the IDT electrode 50 and the reflectors 60, 61 is omitted.

With respect to one of the aforementioned interdigital electrodes in a pair, a lead electrode 45A is perpendicularly drawn from the basbar 51, and an extraction electrode 45 is formed at an end section of the lead electrode 45A, in a longitudinal direction of the piezoelectric substrate 20. With respect to the other of the interdigital electrodes in a pair, a lead electrode 46A is drawn from the basbar 52, in a direction opposite to the lead electrode 45A, and an extraction electrode 46 is formed at end section of the lead electrode 46A, at a position diagonally to the extraction electrode 45. Furthermore, a metal junction 40 is formed over a whole outer edge of the periphery of the front surface 22 of the piezoelectric substrate 20.

Furthermore, a plurality of auxiliary sections 70 are formed in an interspersed fashion, near but without contact with the IDT electrode 50 and the reflectors 60, 61, along both end sides in a longitudinal direction of the IDT electrode 50 and the reflectors 60, 61, i.e., along both end sides in a width direction in the case of such a longitudinal direction as identical to a surface-wave direction. The auxiliary sections 70 are formed thicker than that of the IDT electrode 50, within the bounds of not coming in contact with a back surface 33 of the cover substrate 30. That is, a thickness of the auxiliary sections 70 is set within the bounds of keeping the IDT electrode 50 including the reflectors 60, 61 from coming contact with the back surface 33 of the cover substrate 30 even in the case of occurrence of distortion in the piezoelectric substrate 20 including the surface acoustic wave chip 15 or the cover substrate 30.

In the meantime, in FIG. 2, six auxiliary sections 70 are formed along each end side of the IDT electrode 50 and the reflectors 60, 61 but the number of auxiliary sections 70 is not limited to six but may be increased or decreased. Furthermore, the auxiliary sections 70 is not limited to a position as shown in FIG. 2 but may be disposed at such a position as arbitrarily selected in a scope of achieving a purpose of the invention. Therefore, the auxiliary sections 70 may be disposed along only one end side of the IDT electrode 50 and the reflectors 60, 61.

The piezoelectric substrate 20 is made of crystal in this embodiment, but other than that, a piezoelectric material such as Lithium Tantalate, Lithium Niobate, or the like, can be applied. Furthermore, the IDT electrode 50, the reflectors 60, 61, and the lead electrodes 45A, 46A are formed of an Al film in the light of an electrical property, a processing property, and a cost, but other than the Al film, a conductive metal material such as an aluminum base alloy can be used. The extraction electrodes 45, 46, the auxiliary sections 70, and the metal junction 40 are formed of a Cr/Au film or a Cr/Ni film in a manner to have the same thickness.

The cover substrate 30 is made of a glass plate in a short size and has through holes 34, 35 in a tapered shape extending from a front surface 32 to a back surface 33 thereof. The through holes 34, 35 are disposed diagonally to such the extraction electrodes 45, 46 in a corresponding manner, as formed at the aforementioned piezoelectric substrate 20.

The back surface 33 of the cover substrate 30 has such contact electrodes 73, 74 in a shape corresponding to the extraction electrodes 45, 46, as formed over whole outer edges of peripheries of openings of the through holes 34, 35, respectively. Furthermore, a metal junction 41 formed over a whole outer edge of the periphery of the back surface 33 of the cover substrate 30.

The though holes 34, 35 and the contact electrodes 73, 74 connected thereto has inner circumferential surfaces covered with through-hole electrodes 75, 76 made from conductive metal material. Furthermore, external electrodes 77, 78 are formed around the peripheries of the through holes 34, 35 on the front surface 32 of the cover substrate 30, respectively. The external electrodes 77, 78 are electrically connected to the contact electrodes 73, 74 via the through-hole electrodes 75, 76 formed at the through holes 34, 35, respectively.

In this embodiment, the cover substrate 30 is made of soda glass having a coefficient of thermal close to crystal composing the piezoelectric substrate 20. Furthermore, the contact electrodes 73, 74, and the metal junction 41 are formed of the Cr/Au film or a Cr/Ni/Au film in a manner to have the same thickness. The through-hole electrodes 75, 76, and the external electrodes 77, 78 are formed of the Cr/Au film or the Cr/Ni/Au film in a like manner.

The cover substrate 30 can be formed of other glass materials or an insulating material having a coefficient of thermal expansion approximately equal to or closely analogous to crystal, or the same crystal as that of the piezoelectric substrate 20. Furthermore, where the piezoelectric substrate 20 is made of a piezoelectric material other than crystal, the cover substrate 30 can be formed of a thin-plate-shaped insulating material having a coefficient thermal expansion approximately equal to or closely analogous to the piezoelectric material.

The surface acoustic wave chip 15 and the cover substrate 30 are united by thermocompression bonding of the metal junctions 40, 41, the extraction electrode 45 and the contact electrode 73, and the extraction electrode 46 and the contact electrode 74, The IDT electrode 50, the reflectors 60, 61, and the extraction electrodes 45, 46 are sealed in a space formed between the surface acoustic wave chip 15 and the cover substrate 30. In this embodiment, each of the bonded bodies of the extraction electrode 45 and the contact electrode 73, the extraction electrode 46 and the contact electrode 74, and the metal junctions 40, 41 is formed thicker than the Al film of the IDT electrode 50 and the reflectors 60, 61.

Furthermore, each of the auxiliary sections 70 is formed thicker than the Al film of the IDT electrode 50, the reflectors 60, 61 but thinner than a height of the aforementioned space.

A method of bonding surface acoustic wave chip 15 to the cover substrate 30 can adopt a structure such that an AuSn alloy film is formed to an upper surfaces of the extraction electrodes 45, 46 and the metal junction 40 and bonded thereto by the thermocompression bonding or eutectic bonding.

Therefore, in the surface acoustic wave device 10 according to the first embodiment, since each of the auxiliary sections 70 has a thickness set to be shorter than the aforementioned height of the space but higher than a thickness of the IDT electrode 50, even where the piezoelectric substrate 20 or the cover substrate 30 gets distorted by the externally applied force, the cover substrate 30 is supported by the auxiliary sections 70, thereby not brought in contact with the IDS electrode 50 and the reflectors 60, 61, and thus such excitation or a reception operation of the surface acoustic wave device, as expected beforehand, can be ensured and maintained.

Furthermore, the auxiliary sections 70 are disposed inside the space and are formed, as shown in FIG. 2, in a longitudinal direction along a range provided with the IDT electrode 50 and the reflectors 60, 61 while being formed in a width direction along a range provided with the extraction electrode 45 or 46, thereby not widening a flatbed size even where the auxiliary sections 70 are formed.

Furthermore, the thickness of each auxiliary section 70 is within a scope of thickness of the bonded body of the metal junctions 40, 41, i.e., a scope of height of the space formed at the time of bonding the metal junctions 40, 41, so that the total thickness do not become thin.

Yet further, it is not necessary to form the air gap in a recessed shape to the cover substrate 30 likewise the conventional art, so that the cover substrate 30 can be formed thinly with its great structural strength, thereby being able to provide the downsized and slimed-down surface acoustic wave device.

Method of Manufacturing the Surface Acoustic Wave Device According to the First Embodiment Next, a method of manufacturing the surface acoustic wave device according to this embodiment will be explained with reference to drawings.

Figure 4A:
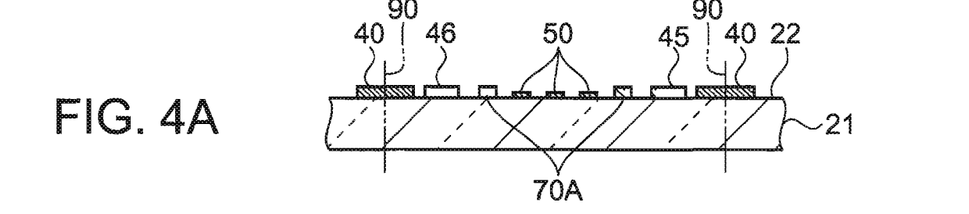
FIGS. 4A through 4E are cross-sectional views showing a manufacturing process of the surface acoustic wave device according to the first embodiment of this invention.

FIGS. 4A through 4E are cross-sectional views showing one example of a manufacturing process of the surface acoustic wave device 10 according to this embodiment. Prepared first is a crystal wafer 21 in a large format having the piezoelectric substrates 20 shown in FIG. 2, arranged thereto, continuously in both portrait and landscape orientations. In FIG. 4A, a Cr/Au film with a predetermined thickness is formed a front surface 22 of the crystal wafer 21, and then the extraction electrodes 45, 46, the metal junction 40, and a first layer 70A of the auxiliary section 70 are formed in a desired shape, using a photolithographic technique.

An Al film with a predetermined thickness is subsequently formed to the front surface 22 of the crystal wafer 21, and the IDT electrode 50, the reflectors 60, 61, and the lead electrodes 45A, 46A, see FIG. 2, are formed in a desired shape using the photolithographic technique in a manner to electrically connect the lead electrode 45A, 46A to the extraction electrodes 45, 46.

Herein, a process for forming the auxiliary sections 70 is explained in further detail. Since the first layer 70A of the auxiliary section 70 has the same thickness as those of the metal junction 40 and the extraction electrodes 45, 46, the auxiliary section 70 is formed by laminating the Cr/Au film which is the same material as that of the extraction electrodes 45, 46, to a front surface of the first layer 70A of the auxiliary section 70 so the auxiliary section 70 as to have the original thickness, after a process for forming the metal junctions 40, the extraction electrodes 45, 46, and the first layer 70A of the auxiliary section 70, see FIG. 4B.

Figure 4B:
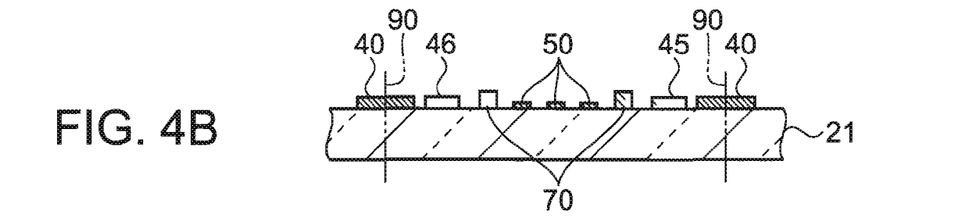
Figure 4C:
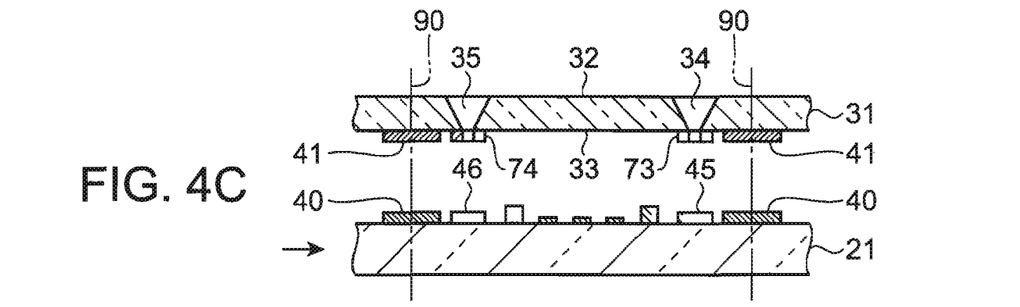

Next, a process for manufacturing the cover substrate 30 will be explained with reference to FIG. 4B.

Prepared first is a glass substrate 31 in a large format having the cover substrates 30 shown in FIG. 3, arranged thereto, continuously in both portrait and landscape orientations. The through holes 34, 35 of each cover substrate 30 are indirectly formed in the cover glass 30 by a sandblast process or etching. The through holes 34, 35 can be easily processed in a desired tapered shape especially by the sandblast process.

Subsequently, the Cr/Au film with a predetermined thickness is formed to a back surface 33 of the glass substrate 31, i.e., an inner surface of the cover substrate in a bonded state, and the contact electrodes 73, 74 and the metal junction 41 are formed in a desired shape using a photolithographic technique.

The cove substrates 30 thus formed, i.e., the glass substrate 31 in this state, and the piezoelectric substrates 20, i.e., the crystal wafer 21 are bonded.

Figure 4D:
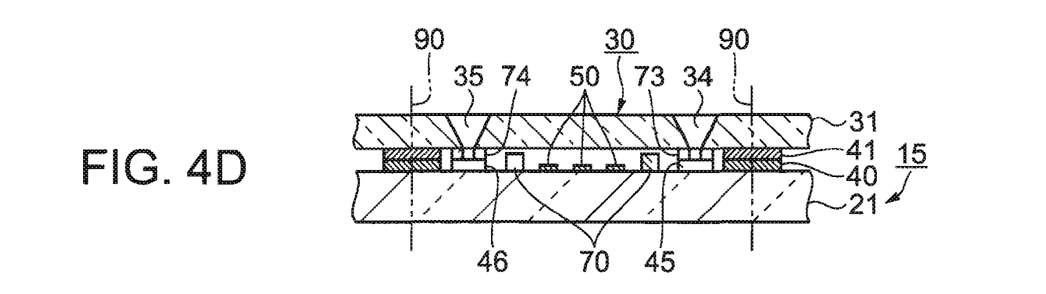

The bonding process is explained with reference to FIG. 4D. As shown in FIG. 4D, the crystal wafer 21 and the glass substrate 31 are vertically positioned, and the metal junctions 40, 41, the extraction electrode 45 and the contact electrode 73, and the extraction electrode 46 and the contact electrode 74 are superimposed each other in a contact state. In this state, the crystal wafer 21 and the glass substrate 31 are bonded each other in a united manner using a bonding device by the thermocompression bonding which applies pressure and heat at the same time.

In this state, the IDT electrode 50, the reflectors 60, 61, see FIG. 1A, and the extraction electrodes 45, 56 are contained in the space formed between the surface acoustic wave chip 15 and the cover substrate 30.

Next, the external electrodes 77, 78 made of the Cr/Au film, or the Cr/Ni/Au film are formed in a desired shape to the front surface 32 of the glass substrate 31, and the through-hole electrodes 75, 76 are subsequently formed thereto.

Figure 4E:
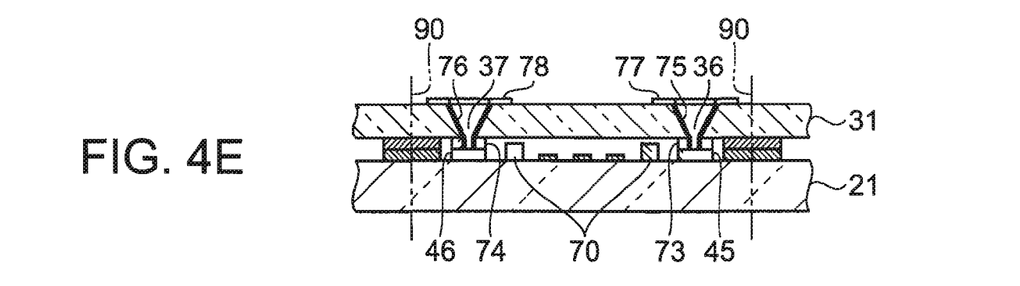

This bonding process is explained with reference to FIG. 4E herein. After cleaning of the laminated body which were bonded, the through-hole electrodes 75, 76 are formed by forming a Cr film and an Au film, or a Cr film, a Ni film and an Au film, to inner circumferential surfaces of the through holes 34, 35 and the contact electrodes 73, 74 by a sputtering method or the like. The through holes 34, 35 are formed in a tapered shape, so that the through-hole electrodes 75, 76 can be easily formed from a top surface of the glass substrate 31 by the sputtering method or the like The through-hole electrodes 75, 76 are set to a thin film, thereby having the through holes 36, 37 in a center position thereof.

A sealing member 80 is formed by filling conductive materials into the through holes 36, 37. This process is explained with reference to FIG. 1B herein. The through holes 36, 37 the through-hole electrodes 75, 76 made of a metal film previously formed to the inner surfaces thereof, thereby resulting in an improved wetting property sufficient to facilitate filling of the sealing member 80. Thus, conductive between the interdigital electrodes of the IDT electrode 50 and the corresponding external electrodes 77, 78, through the contact electrodes 73, 74 and the extraction electrodes 45, 46 as well as hermeticity in the through holes 36, 37 can be made more secure and reliable.

Finally, the surface acoustic wave device 11 shown in FIG. 1 is completed by dicing the laminated body of the glass substrate 31 and the crystal wafer 21 along an outline 90 composing lines intersecting at right angles vertically and horizontally.

By the aforementioned manufacturing method, the auxiliary section 70 is formed by laminating the metal film made of the same material as that of the first layer 70A to the first layer 70A up to a desired thickness after forming the first layer 70A having the same thickness as those of the metal junction 40 and the extraction electrodes 45, 46. A further laminating process is, however, unnecessary in the case where the metal junction 40 and the extraction electrodes 45, 46 are thicker than the IDT electrode 50, and are sufficient to fulfill a function of the auxiliary section 70.

Therefore, by the method of forming the surface acoustic wave device according to the aforementioned first embodiment, the auxiliary sections 70 can be formed in the step of forming the extraction electrodes 45, 46 without requiring the step to sharply increase to form the auxiliary section 70.

Furthermore, the extraction electrodes 45, 46 are connected to the external electrodes 77, 78 through the through-hole electrodes 75, 76 formed to the cover substrate 30, respectively, without crossing over the metal junction 40, thereby being able to retain the hermeticity in the space.

Furthermore, the first layers 70A of the auxiliary sections 70 are be formed in the step of forming the extraction electrodes 45, 46, and the laminating process for setting the auxiliary section 70 a predetermined thickness is further added to the aforementioned step, so that the auxiliary sections 70 can be freely formed in a manner to have a desired thickness by laminating one or more metal layers correspondingly to a requested thickness of the auxiliary section 70.

First Modification Example of First Embodiment

The plurality of auxiliary sections 70 are arranged in an interspersed fashion in the aforementioned first embodiment, see, FIGS. 1 and 2, but arrangement of the auxiliary sections 70 is not limited to the interspersed fashion but can be variously proposed.

FIG. 5 is a plan view showing the surface acoustic wave chip 15 according to a first modification example of the first embodiment. The same reference numbers are assigned to elements common to those in the aforementioned embodiment, see, FIGS. 1 through 3. Relation among elements on the cross-sectional view is substantially the same as that of the first embodiment, so that explanation thereof is omitted. The auxiliary sections are composed of the auxiliary sections 71, 72 formed along both end sides of the IDT electrode 50 and the reflectors 71, 72 in a manner to cross over the lead electrode 45A or 46B. The auxiliary sections 71, 72 are formed along a range provided with IDT electrode 50 and the reflectors 60, 61 in a longitudinal direction but may be formed along a range, i.e., both end sides, of the IDT electrode 50 only or along one end side of the IDT electrode 50 and the reflectors 60, 61 in relation to dimensions of inner areas of the IDT electrode 50, the reflectors 60, 61, and the metal junction 40, within a scope of purpose of this invention.

The same effect of the first embodiment can be obtained with the auxiliary sections thus formed.

Second Modification Example of First Embodiment

FIG. 6 is a plan view showing the surface acoustic wave chip 15 as another modification example of the first embodiment. A second modification example is formed such that the extraction electrodes 45, 46 are enlarged in a manner to have a function of the auxiliary sections as well.

The extraction electrodes 45, 46 are formed along both sides of the IDT electrode 50 and the reflectors 60, 61 in a longitudinal direction, i.e., in a surface-wave direction, in which the extraction electrode 45, 46 are formed in a scope of a formation region of the IDT electrode 50 and the reflectors 60, 61 in a longitudinal direction while being formed in a scope of the extraction electrodes 45, 46 as described in the first embodiment, see, FIG. 1A, in a width direction.

A thickness of the extraction electrode 45, 46 according to the second modification example is corresponding to a height of the aforementioned space. That is, the thickness of the extraction electrode 45, 46 are equal to a height of a bonded body of the metal junctions 40, 41. Herein, it is unnecessary to form the contact electrodes 73, 74 formed to the back surface of the cover substrate 30 in the first embodiment. As described above, the extraction electrodes 45, 46 have the function of the auxiliary sections as well.

A bonding method complies with the aforementioned manufacturing method in the first embodiment, but the metal junctions 40, 41 can be bonded by the thermocompression bonding.

In the case of forming the extraction electrodes 45, 46 according to the second modification example, another bonding method can be applied. For example, such a method can be applied that the cover substrate 30 made of glass is bonded to the metal junction 40 and the extraction electrode 45, 46 by the anodic bonding. Herein, the aforementioned metal junction 41 formed at the cover substrate 30 as described in the first embodiment, see FIG. 1B, is not formed to directly bond the cover substrate 30 to the metal junction 40. Furthermore, a thickness of each of the metal junction 40 and the extraction electrodes, 45, 46 is set to equal to a height of the aforementioned space described in the first embodiment, i.e., a total thickness of the metal junctions 40, 41. In this manner, the cover substrate 30 and the surface acoustic wave chip 15 can be bonded to each other with the space of a height necessary as the auxiliary section.

In this manner, the extraction electrode can have the function of the auxiliary section as well by forming the extraction electrodes 45, 46 in such a shape as shown in FIG. 6, so that the aforementioned effect can be obtained without forming the auxiliary section newly. The extraction electrodes can be formed in a scope of a flatbed size set for the extraction electrode having the original function, thereby not rendering the surface acoustic device to become larger in size.

In FIG. 6, the through holes 34, 35 are formed at positions diagonally to each other in a manner similar to the first embodiment, see FIG. 1A, but those positions can be freely formed in a selectable manner, for example, the through holes 34, 35 can be formed at a center position between the extraction electrodes 45, 46, i.e., a center position of the IDT electrode 50 in a longitudinal direction, thereby resulting in such an effect that a freedom degree in layout for connecting to an external circuit is increased.

Third Modification Example of First Embodiment

A third modification example of the first embodiment will be explained next. According to the third modification example, the auxiliary section can be formed using the same Al film as the IDT electrode 50, at the time of formation of the IDT electrode 50, and the auxiliary section can be shaped the same as the those in the aforementioned embodiment 1, see, FIG. 2 and the first modification example thereof, see, FIG. 5, so that illustration of the auxiliary section is omitted.

According to the third modification example, the Al film is laminated to a front surface of the first layer so the auxiliary section to have a predetermined thickness after formation of the first layer of the auxiliary section in the step of forming the IDT electrode 50 including the reflectors 60, 61 and the lead electrodes 45A, 46A.

According to the third modification example, therefore, the same effect of the first embodiment and the first modification example can be obtained.

Second Embodiment

Subsequently, a second embodiment of this invention will be explained with reference to drawings. The second embodiment is characterized in that the auxiliary section is formed to a front surface of the busbar composing the IDT electrode and the reflectors.

FIG. 7 shows the surface acoustic chip 15 according to the second embodiment, in which FIG. 7A shows a plan view thereof and FIG. 7B shows a cross-sectional view showing a section B-B of FIG. 7A. In FIGS. 7A, 7B, the surface acoustic wave chip 15 is formed by disposing the IDT electrode 50, the extraction electrodes 45, 46, and the metal junction 40 to the front surface 22 of the piezoelectric substrate 20 by the aforementioned manufacturing method according to the first embodiment.

Herein, after formation of the IDT electrode 50 including the reflectors 60, 61 to a front surface of the busbars 51, 52 having the interdigital electrodes consecutively which compose the IIDT electrode 50, auxiliary electrodes 53, 54 are laminated to the IDT electrode 50 in a manner to have a total thickness equal to that of the aforementioned auxiliary sections 70, see FIG. 1B. The auxiliary electrodes 53, 54 are made of the same Al film as the IDT electrode 50.

It is known that disposing the auxiliary electrodes 53, 54 on the front surface of the busbars 51, 52 have no effect on excitation or a reception property. Therefore, where the auxiliary electrodes 53, 54 are disposed at the nearest location to the IDT electrode 50 and the reflectors 60, 61 in the case of disposal of the auxiliary electrodes 53, 54 as the auxiliary section to top surfaces of the busbars 51, 52, respectively, so that a purpose of this invention can be achieved even where a height of the auxiliary electrodes 53, 54 is set to short. Furthermore, a region occupied by the auxiliary electrodes 53, 54 is set within a range provided with the IDT electrode 50 and the reflectors 60, 61, thereby contributing to downsizing of the surface acoustic wave device 10.

Meanwhile, the auxiliary electrodes 53, 53 are formed to the busbars 51, 52, with a width within the bounds of not coming in contact with the interdigital electrodes. This is to prevent the auxiliary electrodes 53, 54 from lying over the region of the interdigital electrodes at the time of laminating and forming the auxiliary electrodes 53, 54 even where those auxiliary electrodes 53, 54 have variety for the reason of manufacturing. The auxiliary electrodes 53, 54 thus formed do not interfere with achievement of a purpose of this invention.

It is to be noted that this invention is not limited to the aforementioned embodiments but includes various modifications or improvements within a scope of a purpose of this invention.

That is, this invention is illustrated and explained especially for the specific embodiments, but those skilled in the art can add modifications to the embodiments as described above in a shape, a material, a combination, other detailed structure, and a processing method in the intervals between the manufacturing steps, without departing from the spirit and scope of this invention.

Therefore, the descriptions as disclosed above, which limited a shape, a material, a manufacturing method, and the like, is made to illustrate this invention in order to facilitate understanding thereof, thereby not limiting this invention, so that this invention includes description using names of members in which one or whole part of limitation to those shape, material, and combination is removed.

In the first embodiment as described above, for example, the auxiliary sections 70 are formed to the piezoelectric substrate 20 by laminating the metal film made of the same material as that of the extraction electrodes 45, 46, but the auxiliary section 70 made of different material may be formed alone to the front surface of the piezoelectric substrate 20.

Furthermore, the auxiliary sections can be formed to the cover substrate 30. In this case, the auxiliary sections can be formed near but without contact with the IDT electrode 50 or the reflectors 60, 61, subsequent to the step of forming the metal junction 41 or the contact electrodes 73, 74, with the same dimensional relation between the auxiliary sections 70 and the cover substrate 30 according to the first embodiment, i.e., in a manner to set a dimensional relation between the auxiliary sections formed on the cover substrate 30 and the surface acoustic wave chip 15 to equal to that of the first embodiment. A purpose of this invention can be achieved with the surface acoustic wave device thus structured.

Therefore, according to the first and second embodiments as described above, such the surface acoustic wave device and the manufacturing method thereof can be obtained in simple steps, that realizing downsizing and sliming-down while having such a structure that the IDT electrode and the cover substrate do not come in contact with each other even where the piezoelectric substrate and the cover substrate get distorted by the externally applied force.

What is claimed is:

1. A surface acoustic wave device comprising:
an IDT electrode formed at a main surface of a piezoelectric substrate;
an extraction electrode extracted from the IDT electrode;
a surface acoustic wave chip having a metal junction formed along a periphery of the main surface of the piezoelectric substrate;
a cover substrate made of an insulting material and having a first surface and a second surface opposing the first surface;
a contact electrode connecting to the extraction electrode formed at the first surface of the cover substrate; and
an external electrode formed at the second surface of the cover substrate,
the cover substrate having a through-hole electrode for connecting the contact electrode to the external electrode, the IDT electrode and the extraction electrode being disposed in a space that is hermetically sealed by bonding the metal junction of the surface acoustic wave chip to the first surface of the cover substrate, an auxiliary section being formed on the main surface of the piezoelectric substrate within the space, and having a height to prevent the cover substrate from coming in contact with the IDT electrode even in the case of distortion in the piezoelectric substrate or the cover substrate, and the auxiliary section being a metal film formed in a longitudinal direction of the IDT electrode, near but without contact with the IDT electrode.

2. An IDT electrode formed at a main surface of a piezoelectric substrate;

an extraction electrode extracted from the IDT electrode;

a surface acoustic wave chip having a metal junction formed along a periphery of the main surface of the piezoelectric substrate;

a cover substrate made of an insulting material and having a first surface and a second surface opposing the first surface;

a contact electrode connecting to the extraction electrode formed at the first surface of the cover substrate; and an external electrode formed at the second surface of the cover substrate, the cover substrate having a through-hole electrode for connecting the contact electrode to the external electrode, the IDT electrode and the extraction electrode being disposed in a space that is hermetically sealed by bonding the metal junction of the surface acoustic wave chip to the first surface of the cover substrate, an auxiliary section being formed on the main surface of the piezoelectric substrate within the space, and having a height to prevent the cover substrate from coming in contact with the IDT electrode even in the case of distortion in the piezoelectric substrate or the cover substrate, the extraction electrode being formed mainly in a formation region of the IDT electrode in a longitudinal direction thereof, and the extraction electrode being formed to have a total thickness thereof that is equal to the height of the space, the extraction electrode having a combined function of the auxiliary section.

3. A surface acoustic wave device comprising:

an IDT electrode formed at a main surface of a piezoelectric substrate;

an extraction electrode extracted from the IDT electrode;

a surface acoustic wave chip having a metal junction formed along a periphery of the main surface of the piezoelectric substrate;

a cover substrate made of an insulting material and having a first surface and a second surface opposing the first surface;

a contact electrode connecting to the extraction electrode formed at the first surface of the cover substrate; and an external electrode formed at the second surface of the cover substrate, the cover substrate having a through-hole electrode for connecting the contact electrode to the external electrode, the IDT electrode and the extraction electrode being disposed in a space that is hermetically sealed by bonding the metal junction of the surface acoustic wave chip to the first surface of the cover substrate, an auxiliary section being formed on the main surface of the piezoelectric substrate within the space, and having a height to prevent the cover substrate from coming in contact with the IDT electrode even in the case of distortion in the piezoelectric substrate or the cover substrate, and the IDT electrode having a busbar, and the auxiliary section being formed at a surface of the busbar.

* * * * *